(12) United States Patent
Freudenberg et al.

(10) Patent No.: US 6,917,141 B2
(45) Date of Patent: Jul. 12, 2005

(54) DEVICE WITH A PIEZOELECTRIC ACTUATOR

(75) Inventors: Hellmut Freudenberg, Grossberg (DE); Wendelin Klügl, Seubersdorf (DE); Marcus Unruh, Zeitlarn (DE); Andreas Voigt, Regensburg (DE); Claus Zumstrull, Regenstauf (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/795,005

(22) Filed: Mar. 5, 2004

(65) Prior Publication Data

US 2004/0169445 A1 Sep. 2, 2004

Related U.S. Application Data

(63) Continuation of application No. PCT/DE02/03248, filed on Sep. 3, 2002.

(30) Foreign Application Priority Data

Sep. 12, 2001 (DE) .......................................... 101 44 919

(51) Int. Cl.$^7$ ............................. H01L 41/08; H02N 2/02
(52) U.S. Cl. .............. 310/328; 310/316.01; 310/316.03
(58) Field of Search ........................... 310/328, 316.01, 310/316.03; 123/478

(56) References Cited

U.S. PATENT DOCUMENTS

| | | | | |
|---|---|---|---|---|
| 4,803,393 A | | 2/1989 | Takahashi | 310/328 |
| 6,274,967 B1 | * | 8/2001 | Zumstrull et al. | 310/328 |
| 6,452,308 B1 | * | 9/2002 | Heinz et al. | 310/328 |

FOREIGN PATENT DOCUMENTS

| | | | | |
|---|---|---|---|---|
| DE | 196 53 555 A1 | 6/1998 | | H02N/2/04 |
| DE | 197 15 487 A1 | 10/1998 | | H02N/2/02 |
| DE | 198 18 036 A1 | 11/1999 | | H01L/23/28 |
| DE | 199 30 585 A1 | 2/2000 | | H02N/2/04 |
| DE | 198 60 001 A1 | 7/2000 | | H01L/41/083 |
| DE | 199 10 111 A1 | 10/2000 | | H01L/41/053 |
| DE | 199 28 187 C1 | 12/2000 | | H01L/41/047 |
| EP | 0 948 062 A2 | 3/1999 | | H01L/41/083 |
| WO | WO98/47187 | 10/1998 | | H01L/41/083 |

* cited by examiner

Primary Examiner—Tom Dougherty
Assistant Examiner—J. Aguirrechea
(74) Attorney, Agent, or Firm—Baker Botts L.L.P.

(57) ABSTRACT

A device with a piezoelectric actuator (1) comprises two faces (2, 3) and two electroconductive contact paths (4, 5), each traversing the actuator (1) starting from at least one face (3). The actuator is clamped between two metallic plates (6, 7), each arranged against a face (2, 3). The piezoelectric actuator further comprises an electroinsulating layer (8) arranged between each face 92, 3) and the corresponding metallic plate (6, 7).

16 Claims, 1 Drawing Sheet

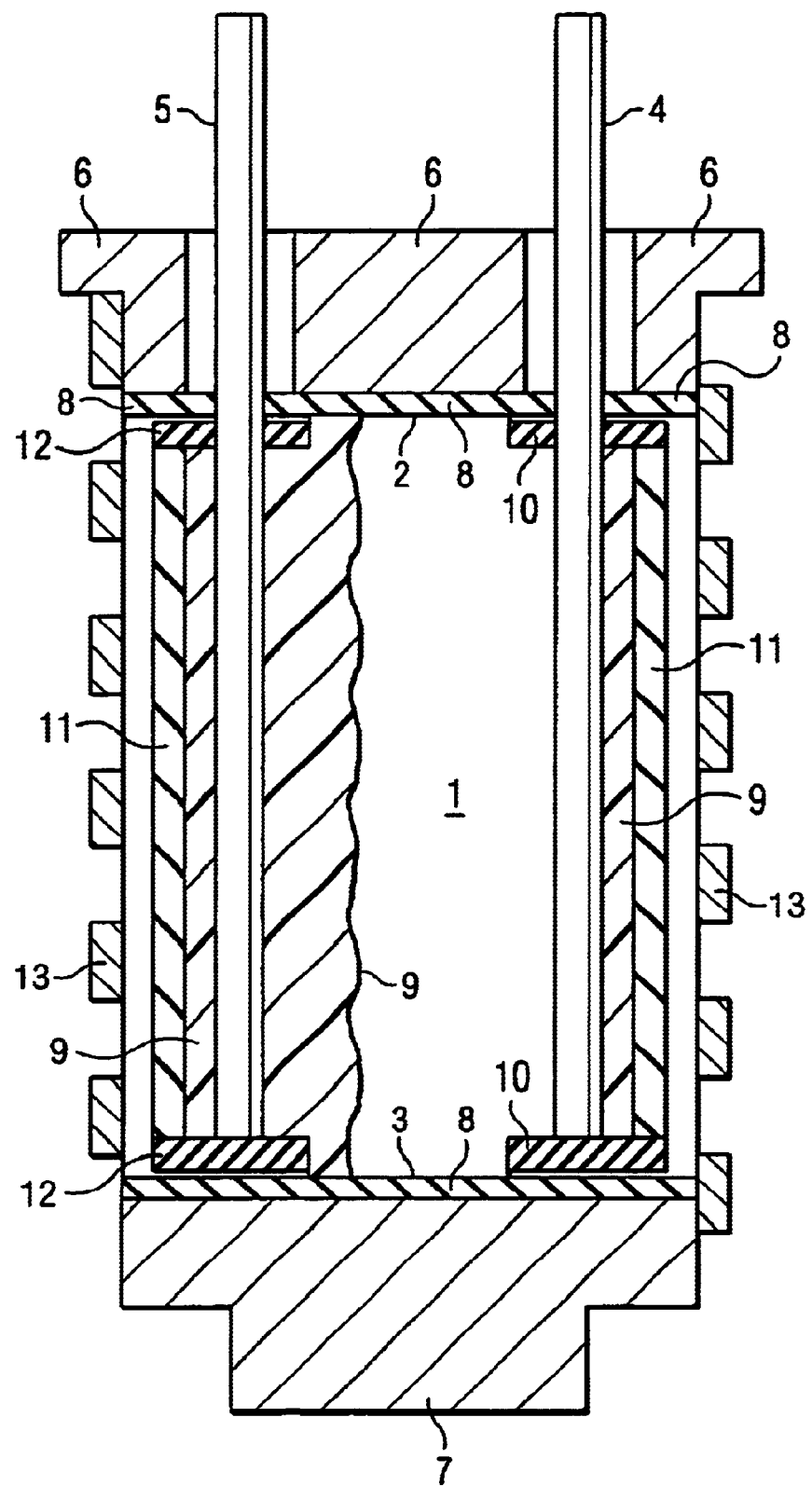

DEVICE WITH A PIEZOELECTRIC ACTUATOR

CROSS REFERENCE TO RELATED APPLICATION

This application is a continuation of copending International Application No. PCT/DE02/03248 filed Sep. 3, 2002 which designates the United States, and claims priority to German application no. 101 44 919.4 filed Sep. 12, 2001.

TECHNICAL FIELD OF THE INVENTION

The invention relates to a device with a piezoelectric actuator, which comprises two faces and two electroconductive contact paths, each traversing said actuator starting from at least one face and which is clamped between two metallic plates, each arranged against a face.

DESCRIPTION OF THE RELATED ART

References to such a device and the significant technological background can be obtained from the following documents: WO 98/47187 A, EP 0 948 062 A, DE 198 18 036 A, DE 199 30 585 A, DE 198 60 001 A and DE 199 10 111 A.

The invention relates in particular to a device in which the actuator is a ceramic multilayer actuator and therefore comprises a plurality of alternately arranged piezoelectric ceramic layers and metallically conductive layers. Such a device is used in particular as an actuator in a fuel injection device for an internal combustion engine and is preferably deployed in a common rail type fuel injection device in a multicylinder diesel engine.

In this device electroconductive parts of the actuator are comparatively close to the metallic plates against its faces. This can result in an electrical short-circuit between electroconductive parts of the actuator and a plate, in some cases assisted by the fracture of an electroconductive component. Such a short-circuit can result in total functional failure of the device. Also the casing of the actuator generally provided away from its face with lateral insulation does not help, as this lateral insulation expediently maintains a certain distance from the plates and therefore cannot protect the areas of the actuator most at risk as a result of a short-circuit, which are immediately adjacent to the plate.

SUMMARY OF THE INVENTION

The object of the invention is therefore to develop a device of the above-mentioned type so that a short-circuit between an electroconductive component of the actuator and one of the plates is reliably prevented.

To achieve this object a device is specified that comprises a piezoelectric actuator, which a) has two faces and two electroconductive contact paths, each traversing said actuator starting from at least one face;

b) is clamped between two metallic plates, each arranged against a face, with which device an electroinsulating layer is arranged between each face and the plate arranged against it.

This insulating layer or these insulating layers (one against each face of the actuator) enable the said short-circuit to be reliably prevented. This increases the functional reliability of the device, prevents functional failure due to short-circuits and thereby in particular reduces the rejection rate in the context of the mass production of such devices.

The insulating layer is preferably made of a ceramic material. The insulating layer can thereby be connected in a material actuated manner to a plate and be preferably executed for this purpose as a sprayed, in particular plasma-sprayed or enameled layer or a separate component.

The actuator is preferably a ceramic multilayer actuator of the above-mentioned type.

The actuator is also preferably enclosed between the faces by lateral insulation, whereby said lateral insulation is preferably at a greater distance from each insulating layer. This serves to relieve the lateral insulation of mechanical stress as results from the clamping of the actuator between the plates and is further increased in some circumstances in the context of the operation of the actuator. Reference is made below to the description of a preferred exemplary embodiment of said lateral insulation.

It is particular preferable for each contact path to be continued by an associated recess in a plate. This facilitates electrical contact on the part of the actuator.

The plates are preferably connected to each other in a force actuated manner via a spring element; the spring element is also thereby preferably a tube spring enclosing the actuator.

The device is in particular a component of a fuel injection device for an internal combustion engine and thereby serves in particular as a control element in a common rail type fuel injection device for a multicylinder diesel engine.

An exemplary embodiment of the invention is shown in the drawing. The drawing is only to be conceived as a sketch; it is not intended that it should be a scale reproduction of an actual device.

BRIEF DESCRIPTION OF THE DRAWINGS

The device that can be identified from the FIGURE comprises a piezoelectric actuator 1, which has two faces 2 and 3 and two electroconductive contact paths 4 and 5, whereby each contact path 4 or 5 traverses the actuator 1 starting from at least one face 2 or 3—actually both faces 2 and 3 are traversed by the contact paths 4 and 5.

DETAILED DESCRIPTION OF THE PREFERRED EMBODIMENTS

The actuator 1 is a multilayer actuator comprising a plurality of piezoelectric layers separated from each other by metallic layers. Each metallic layer is thereby connected for example by means of a wire (not illustrated for purposes of clarity) to one of the contact paths 4 and 5. Deformation of the actuator 1 is achieved by applying an electric voltage between the contact paths 4 and 5.

The actuator 1 is clamped between two metallic plates 6 and 7, each of which is arranged against a face 2 or 3. This gives rise to the problem that the electroinsulation between each plate 6 or 7 and the actuator 1 has to be so well executed that it is guaranteed even if a contact means fractures between a metallic layer of the actuator 1 and a contact path 4 or 5 and possibly approaches the respective plate 6 or 7 to a significant degree. In such a case this can result in electrical contact or an electrical arc, as a result of which in any case a short-circuit is triggered and the actuator 1 may be rendered non-functional, irrespective of further possible damage. To prevent this, an electroinsulating insulating layer 8 is arranged between each face 2 or 3 and the plate 6 or 7 arranged against it. This comprises a ceramic material.

A first alternative provides for the insulating layer 8 to be connected in a material actuated manner to the corresponding plate 6 or 7. The insulating layer 8 is then executed in particular as a sprayed or enameled layer. According to a second embodiment the insulating layer 8 is executed as a separate component and is inserted during assembly of the device between the actuator 1 and the corresponding plate 6 or 7.

Between the faces 2 and 3 the actuator 1 is enclosed by a lateral insulation comprising a viscous or visco-elastic mass 9, which is enclosed by an insulating cylinder 11 with insulating end plates 10. The end plates 10 engage in recesses 12 on the faces 2 and 3.

The plates 6 and 7 are connected in a force actuated manner to each other via a spring element 13, in the present case a slotted tube spring 13. The tube spring 13 thereby encloses the actuator 1 completely and at the same time protects it from damage.

The device is a component of a fuel injection device for an internal combustion engine, whereby it serves as an actuating element for an injection valve.

The device is characterized by reliable operation, which is even guaranteed when the device is subject to impairment due to a broken electrical connection within the actuator. This makes it particularly suitable for use in the context of automotive engineering.

We claim:

1. A device comprising a piezoelectric actuator, said actuator comprising:

first and second actuator faces and first and second electroconductive contact paths, each path traversing said actuator running from one face to the other face;

said actuator clamped between two metallic plates, each arranged against a face wherein an electroinsulating layer is arranged between each actuator face and each plate.

2. The device according to claim 1, wherein the electroinsulating layer is made of a ceramic material.

3. The device according to claim 2, wherein the electroinsulating layer comprises a sprayed or enamel layer.

4. The device according to claim 2, wherein the electroinsulating layer is a disc.

5. The device according to claim 1, wherein the actuator is a ceramic multilayer actuator.

6. The device according to claim 1, wherein the actuator is enclosed by lateral insulation between the faces.

7. The device according to claim 6, wherein the lateral insulation is not in contact with each electroinsulating layer.

8. The device according to claim 1, wherein each contact path is continued by an associated recess in a plate.

9. The device according to claim 1, wherein the plates are connected in a force actuated manner via a spring element.

10. The device according to claim 9, wherein the spring element is a tube spring, which encloses the actuator.

11. A device comprising:

a piezoelectric actuator having top and bottom actuator faces and two electroconductive contact paths, each path traversing said actuator starting from one face and running to the other face;

two metallic plates, one of each arranged against said top and bottom actuator faces and two electroinsulating layers, one of each arranged between said actuator faces and the metallic plates.

12. The device according to claim 13, wherein the electroinsulating layers are made of a ceramic material.

13. The device according to claim 12, wherein the electroinsulating layer is a sprayed or enamel layer.

14. The device according to claim 11, wherein each contact path is continued by an associated recess in a plate.

15. The device according to claim 11, wherein the plates are connected in a force actuated manner via a spring element.

16. The device according to claim 15, wherein the spring element is a tube spring enclosing the actuator.

* * * * *